(12) United States Patent
Rahn et al.

(10) Patent No.: US 6,720,594 B2
(45) Date of Patent: Apr. 13, 2004

(54) IMAGE SENSOR ARRAY WITH REDUCED PIXEL CROSSTALK

(75) Inventors: Jeffrey T. Rahn, Mountain View, CA (US); Koenraad F. Van Schuylenbergh, Mountain View, CA (US); Jeng Ping Lu, San Jose, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 10/041,544

(22) Filed: Jan. 7, 2002

(65) Prior Publication Data

US 2003/0127672 A1 Jul. 10, 2003

(51) Int. Cl.[7] .............................................. H01L 27/00
(52) U.S. Cl. ...................... 257/291; 257/292; 257/293; 250/208.1; 348/302
(58) Field of Search ................... 257/291–293, 257/443, 444; 250/208.1, 214 R, 214.1, 370.01–370.5; 348/302–308, 158, 187, 246, 296, 298, 311, 312

(56) References Cited

U.S. PATENT DOCUMENTS 6,150,676 A  * 11/2000  Sasaki ....................... 257/191

OTHER PUBLICATIONS

D. L. Lee et al., "A New Digital Detector for Projection Radiography," SPIE, 2432, pp. 237–249, 1995.*
Article entitled: "High Resolution X-ray Imaging Using Amorphous Silicon Flat–Panel Arrays", Rahn et al., IEEE Transactions On Nuclear Science, vol. 46, No. 3, Jun. 1999. pp. 457–461.
Article entitled: "High Resolution, High Fill Factor a–Si:H Sensor Arrays For Medical Imaging", Rahn et al, SPIE Conference on Physics of Medical Imaging, SPIE vol. 3659, Feb. 1999, pp. 510–517.
R. A. Street et al., "Large Area Image Sensor Arrays", in Technology and Applications of Amorphous Silicon, Editor R. A. Street, Springer Series in Materials Science 37, Springer–Verlag, Berlin, 2000, chapter 4, p. 147.

* cited by examiner

Primary Examiner—Thomas L Dickey
(74) Attorney, Agent, or Firm—Bever, Hoffman & Harms, LLP; Patrick T. Bever

(57) ABSTRACT

Improved pixel circuits are disclosed for high fill-factor large area imager systems using continuous (e.g., amorphous silicon) sensor layers. A first approach prevents crosstalk by ensuring that each pixel is not able to go into saturation. A second approach employs a cascode transistor to maintain the bias of the sensor contact at a constant potential regardless of illumination condition. These two approaches may be combined. A resistive film connecting the pixel contacts may be used in conjunction with the second approach to prevent aliasing of signal and noise.

26 Claims, 5 Drawing Sheets

IMAGE SENSOR ARRAY WITH REDUCED PIXEL CROSSTALK

FIELD OF THE INVENTION

This invention relates to imager systems, and in particular imager systems utilizing high fill-factor image sensor arrays.

BACKGROUND OF THE INVENTION

Recent developments in the field of image sensing technology have focused on the switch from relatively low fill-factor image sensor arrays, which utilize an array of isolated sensors to detect light, to relatively high fill-factor image sensor arrays that utilize a continuous layer of sensor material formed over an array of pixel circuits. Each pixel circuit of these high fill-factor image sensor arrays includes an access transistor and a contact (i.e., a metal pad) that is connected to the lower surface of the sensor material layer. A continuous transparent bias layer (e.g., indium tin oxide (ITO)) is typically formed on an upper surface of the continuous sensor material layer. Each sensor operates on the principal of integrating a charge representative of the quantities of radiation incident on the sensor. When an image is to be captured by the image sensor array, radiation (e.g., light or X-rays) conveying the image strikes the sensor material layer, which responds by freeing electrons and holes that generate a local current in the sensor material layer between the pixel contacts and the continuous bias layer. These local currents change the potentials on the underlying pixel contacts according to the amount of light incident thereon. The potential on each pixel contact is periodically "read" by sequentially turning on the access transistors to couple the pixel contacts to a series of charge-sensing amplifiers. The differences between the various potentials read from the pixel contacts are then used to reconstruct the captured image.

One well-known type of high fill-factor image sensor array utilizes hydrogenated amorphous silicon (a-Si H) sensor material for real time imaging (see R. A. Street et al., "Large Area Image Sensor Arrays", in Technology and Applications of Amorphous Silicon, Editor R. A. Street, Springer Series in Materials Science 37, Springer-Verlag, Berlin, 2000, chapter 4, p 147, for a general description of the structure of the arrays). Such a-Si H sensor arrays are particularly advantageous for X-ray imaging because they present a relatively large size image sensor array. In the direct detection approach, incident high-energy radiation (e.g., X-ray photons) is directly converted to a charge by the sensor. In the indirect detection approach, a phosphor converter absorbs high-energy radiation (e.g., X-ray photons) and generates a proportional amount of visible light that is then converted to a charge by the sensor.

An obvious problem associated with the use of continuous sensor material layers is crosstalk between adjacent pixels, which occurs when the continuous sensor layer allows conduction between pixel contacts. This form of crosstalk directly reduces the resolution of the image sensor array because a sharp feature will be blurred into neighboring pixels. As mentioned above, as the sensor material located over one pixel is illuminated, the charge from the illumination builds up on that pixel's contact. This shifts the voltage on that contact towards the bias voltage level applied to the continuous bias layer. If the sensor layer allows lateral conduction, then the potential difference between adjacent pixels will result in conduction from one pixel to the next. Experimentally, in image sensor arrays utilizing continuous a-Si H sensor material layers, this form of crosstalk has been observed with varying magnitude, but primarily is a problem as the pixel reaches saturation (i.e., approaches forward bias). See Rahn J. T. et al. "High-Resolution High Fill Factor a-Si H Sensor Arrays for Medical Imaging," Proc. of SPIE, Vol. 3659, pp. 510–517, 1999.

Another problem associated with high fill-factor image sensor arrays, which is also a problem with all pixilated structures, is the rejection of high spatial frequency signals. Because the pixilation of an image sensor array acts as a sampling function, high spatial frequency signals are aliased into lower frequencies. High fill-factor image sensor arrays (described above) reduce the impact of aliasing, but do not eliminate it. In many imaging systems, the image source can be designed to reject high spatial frequencies, for example, by designing the focus of the optical system to blur the image and reject high spatial frequencies. In addition, indirect x-ray detection typically does not have much of a problem with aliasing, since the phosphor screen rejects high spatial frequencies. However, in direct detection imagers that do not include optical blurring, the effects of aliasing can be clearly seen. Even if the imager can be designed so that high spatial frequencies are filtered on the imager, the noise will also be aliased and the total noise power increased, which reduces the Detector Quantum Efficiency (DQE) of the imager.

Accordingly, what is needed is a high fill-factor image sensor array that significantly reduces crosstalk between adjacent pixels. What is also needed is a high fill-factor image sensor array that filters high spatial frequency signals prior to imaging.

SUMMARY OF THE INVENTION

The present invention is directed to a high fill-factor image sensor arrays in which the image resolution is improved by reducing crosstalk between adjacent pixels. This crosstalk reduction is achieved by the various embodiments of the present invention by clamping the sensor voltage (e.g., the voltage across the photodiode of each pixel) to prevent saturation, and/or by maintaining the pixel contact at a fixed voltage.

In accordance with a first embodiment, a high fill-factor imager system includes a scanning control circuit for generating gate voltage signals on a plurality of gate lines, a bias voltage source, and an imager including a plurality of pixels arranged in an array. Each pixel of the array includes a sensor (e.g., a photodiode) for generating a charge, a storage capacitor for storing the charge, and an access transistor connected between the storage capacitor and an associated data line of the array. The sensor includes a first terminal (e.g., an anode) that is maintained at a predetermined bias voltage by the bias voltage source, and a second terminal (e.g., a cathode) connected to a first terminal of the storage capacitor. A second terminal of the storage capacitor is connected to a system voltage source. At the beginning of an imaging cycle, the second terminal (cathode) of the sensor is reset such that a predetermined voltage exists across the sensor. Light (or other radiation) striking the sensor generates a proportional charge therein. This charge is stored by the storage capacitor, and is passed to the associated data line during a subsequent readout operation.

Pixel clamping in the first embodiment is achieved either by maintaining the bias voltage well below the gate off voltage of the access transistors, or by periodically pulsing the gate voltage to drain excess charge during exposure and between readout cycles. Note that the description of this invention assumes n-type transistors and a sensor biased negative with respect to the data line. This invention is not limited, however, to this polarity. According to the first approach, the scanning control circuit generates either a gate on voltage, which turns on the access transistors of a column of pixels during readout/reset, or a gate off voltage that turns off the access transistors. By maintaining the bias voltage at least one threshold voltage of the access transistors below the gate off voltage, excess charge is drained from the storage capacitor onto the data line through the turned-off access transistor when the cathode voltage gets too close to the bias voltage, thereby preventing the photodiode (sensor) from reaching saturation. A potential problem with this approach is that draining charge onto the data line during the readout cycle of another pixel connected to that data line can result in unwanted crosstalk. Therefore, according to the second approach, in addition to the gate on and gate off voltages, the scanning control circuit generates additional voltage pulses during exposure at times between the readout operations of the pixels connected to the data line. These additional voltage pulses, which have a voltage level that is less than that of that used for readout operations, allow charge from one pixel to drain onto a data line without disrupting readout operations from other pixels connected to the same data line.

In accordance with a second disclosed embodiment, a high fill-factor image sensor array includes circuitry similar to that of the first embodiment, but each pixel also includes a clamp transistor connected in parallel with the storage capacitor between the system voltage source and the sensor. The clamp transistor is controlled by a global clamp voltage that is at least one threshold voltage above (or below, if polarities are reversed) the bias voltage, thereby causing the clamp transistor to drain excess charge from the storage capacitor before the photodiode saturates.

In accordance with a third disclosed embodiment, a high fill-factor image sensor array includes circuitry similar to that of the first embodiment, but each pixel also includes a cascode transistor connected in series between the storage capacitor and the sensor. The cascode transistor is controlled by a global control voltage that is at least one threshold voltage of the cascode transistor above the bias voltage, thereby causing the cascode transistor to maintain the second terminal of the sensor (e.g., the cathode of the photodiode), which is connected to the pixel contact, at a fixed voltage level. When the sensors of the pixel array are formed using a continuous film of a-Si H, maintaining all of the pixel contacts at the fixed voltage level prevents crosstalk by minimizing potential differences between adjacent pixel contacts.

In accordance with a fourth embodiment, both the clamp transistor of the second embodiment and the cascode transistor of the third embodiment are combined to enhance crosstalk reduction.

In accordance with a variation of the third and fourth disclosed embodiments, a resistive film is provided between the sensors (e.g., photodiodes) of the various pixels that acts as a filter for high spatial frequencies. Typically, the continuous a-Si:H sensor layer includes relatively heavily doped (n+) regions formed over each pixel contact that are separated from adjacent pixels by undoped (intrinsic) a-Si:H. In contrast, the resistive film is formed by a continuous, relatively lightly doped (n) layer that connects all of the relatively heavily doped regions. This resistive film allows localized areas of high illumination to diffuse into adjacent pixels before imaging (readout), thereby filtering high spatial frequencies and avoiding image aliasing.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

Figure 1:
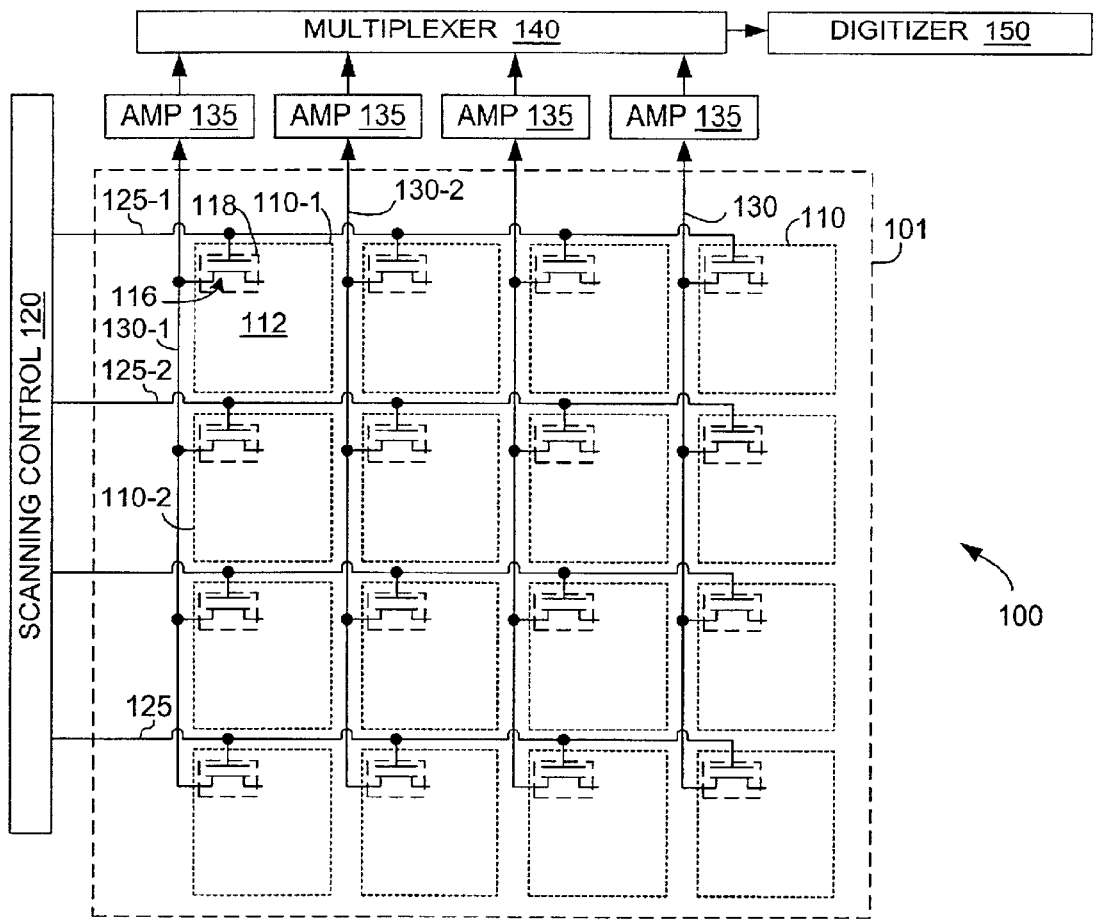
FIG. 1 is a simplified circuit diagram showing a simplified imager system.

The present invention is described below with reference to high fill-factor, large area amorphous silicon (a-Si:H) imager systems, and is particularly directed to structures and methods for optimizing the resolution of these imaging arrays by reducing crosstalk between adjacent pixels of an imaging system, and/or improving sensor performance by filtering high spatial frequency signals prior to imaging. FIG. 1 illustrates a general imager system 100 incorporating the various structures and methods of the present invention. FIGS. 2–7 illustrate a first approach to reducing crosstalk between adjacent pixels by clamping pixel voltages to prevent saturation of each pixel's photodiode (sensor). FIGS. 8–11 illustrate a second approach in which a cascode transistor is used to maintain the pixel contact at a fixed voltage, thereby reducing crosstalk by minimizing potentials between adjacent pixels. FIG. 12 illustrates another embodiment in which the two approaches are combined. Although many the imager systems described below are described as using a-Si:H sensor layers, some or all of the various aspects of the present invention may also be used in imager systems utilizing other sensor materials (e.g., Se, $PbI_2$, and HgI sensors) and structures. Also, the following description and accompanying drawings assume n-type transistors and a sensor biased below the data line. The invention, however, is not limited to this combination only.

FIG. 1 is a circuit diagram showing a simplified imager system 100 including an imager 101 including an array of pixels 110, each pixel 110 including a sensor circuit 112 and an access thin film transistor (TFT) 116 that may be covered by an optional light shield 118. A scanning control circuit 120 generates gate voltages that turn on and turn off access TFTs 116 one row at a time via a series of parallel gate lines 125. As each row of access TFTs 116 is turned on, an image charge is transferred from the corresponding light sensors 112 to a series of parallel data lines 130, which are respectively connected to readout (charge sensitive) amplifiers 135. By drawing the charge from the pixels during readout, readout amplifiers 135 reset the potential at each sensor circuit 112. The resulting amplified signal for each row is multiplexed by a parallel-to-serial converter or multiplexer 140, and then transmitted to an analog-to-digital converter or digitizer 150.

Figure 2:
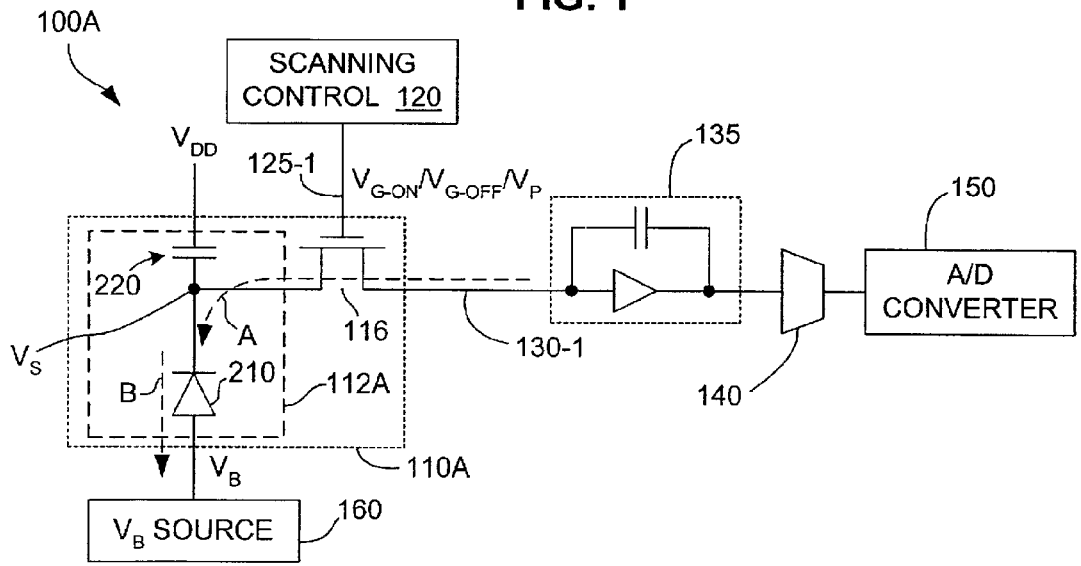
FIG. 2 is a simplified diagram showing a single pixel circuit of an imager system according to an embodiment of the present invention.

FIG. 2 is a simplified circuit diagram showing a representative pixel 110A and associated circuitry of an imager system 100A, which represents an embodiment of imager system 100 (shown in FIG. 1). A pixel 110A of imager system 100A includes a sensor circuit 112A made up of a photodiode 210 and a storage capacitor 220, and an access TFT 116. Scanning control circuit 120 generates gate voltages $V_{G\text{-}ON}$, $V_{G\text{-}OFF}$, and optional voltage $V_P$ that turn on and turn off access TFT 116 via gate line 125-1 according to the description provided below. The anode of photodiode 210 is connected to a constant bias voltage source ($V_B$ SOURCE) 160, which generates a bias voltage $V_B$ according to the description provided below. Storage capacitor 220 includes a first terminal connected to a system voltage source ($V_{DD}$), and a second terminal connected to the cathode of photodiode 210 and to one terminal of access TFT 116.

Figure 3:
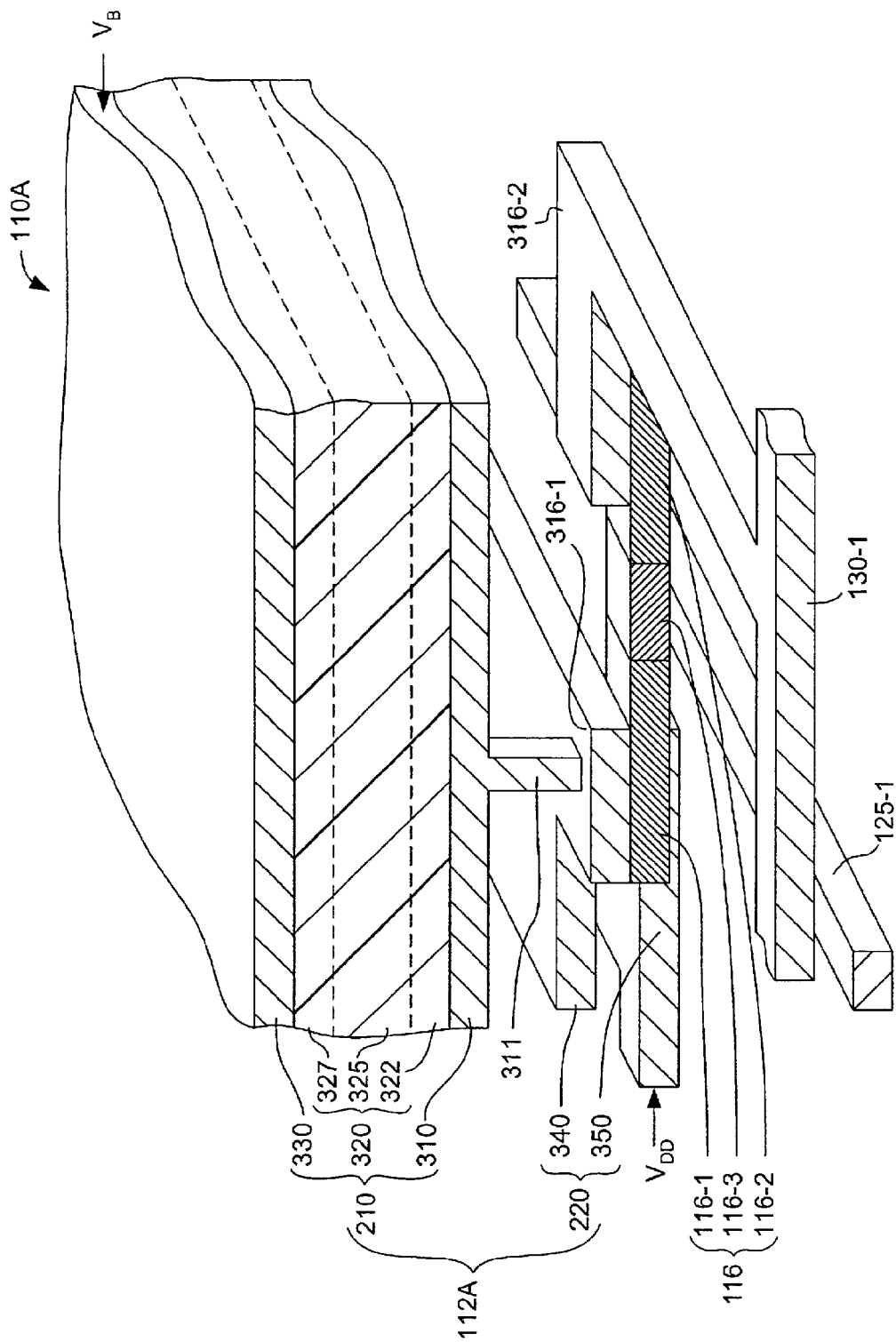
FIG. 3 is a front perspective view depicting a portion of the pixel circuit shown in FIG. 2.

FIG. 3 is simplified perspective view showing pixel 110A in additional detail. Pixel 110A is formed over a substrate (not shown) using established large area thin film processes that are adapted from fabricating flat panel displays. As mentioned above, pixel 110A includes sensor circuit 112A, which is made up of a photodiode 210, a storage capacitor 220, and an access TFT 116.

Access TFT 116 includes a first (doped) terminal 116-1 that is connected to a first metal structure 316-1, a second (doped) terminal 116-2 that is connected by a second metal structure 316-2 to associated data line 130-1, and a channel region 116-3 extending between terminals 116-1 and 116-2. In one embodiment, access TFT 116 is formed using amorphous silicon, although other TFT structures may also be used (e.g., polysilicon TFTs). Associated gate line 125-1 extends under channel region 116-3.

Photodiode 210 is formed by a first metal plate (contact) 310, a sensor layer 320 (e.g., amorphous silicon (a-Si:H)), and a transparent upper biasing layer 330 (e.g., ITO) to which is applied bias voltage $V_B$. Sensor layer 320 includes a lower n+ doped region 322, a central undoped region 325, and an upper p+ doped region 327. Central undoped region 325 and upper p+ doped region 327 extend continuously over all pixels of the sensor array. In contrast, each lower n+ doped region 322 is isolated on an associated first metal plate 310 (i.e., formed only in the region of an associated pixel 110A, and separated from neighboring n+ doped regions).

Capacitor 220 is formed by a second metal plate 340, which is connected to first metal plate 310 by a metal via 311 that extends through an insulation layer (not shown), and a third metal plate 350, which is disposed under second metal plate 340 and separated by another suitable layer of insulation. In the disclosed embodiment, second metal plate 340 includes a metal structure 316-1. As indicated in the left side of FIG. 3, third metal plate 350 receives system voltage $V_{DD}$.

Referring again to FIG. 2, imager system 100A includes one or more circuits that clamp the voltage across photodiode 210 such that photodiode 210 is prevented from forward biasing. As mentioned above, crosstalk between adjacent pixels is primarily a problem when a pixel (i.e., the pixel's photodiode) reaches saturation. To prevent saturation of photodiode 210, imager system 110A is controlled by one of scanning control circuit 120 and bias voltage source 160 such that the voltage across each photodiode 210 is maintained below the photodiode saturation voltage. Note that the convention utilized herein refers to a positive forward bias, and a negative reverse bias. Those of ordinary skill in the art will recognize that an equivalent structure can be constructed wherein polarities are reversed. Therefore, the disclosed structure is intended to be exemplary, and not limiting.

Figure 4:
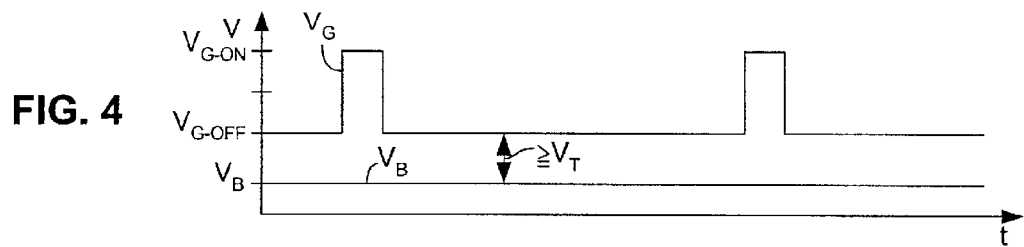
FIG. 4 is a timing diagram illustrating the operation of the imager system of FIG. 2 according to an aspect of the present invention.

Referring to FIG. 4, according to a first aspect of the present invention, clamping is achieved by providing bias voltage source 160 such that bias voltage $V_B$ is at a voltage level that is at least one threshold voltage ($V_T$) of access transistor 116 below the gate "off" voltage $V_{G\text{-}OFF}$ generated by scanning (gate line) control circuit 120. In particular, scanning control circuit 120 generates gate voltage $V_G$ on gate line 125-1 that alternates between a gate on (first) voltage signal $V_{G\text{-}ON}$ (e.g., 10V) to turn on access transistor 116 during read/reset (first) operating periods, or the gate off (second) voltage signal $V_{G\text{-}OFF}$ (e.g., 2V) to turn off access transistor 116 of the selected pixel during idle (second) operating periods. In accordance with the first aspect, bias voltage $V_B$ is set at a voltage level that is at least one threshold voltage of access transistor 116 below $V_{G\text{-}OFF}$. It is noted that while clamping is achieved using this arrangement, charge is drained from storage capacitor 220 onto data line 130-1 through access transistor 116, which will show up as crosstalk during the readout of all other pixels connected to data line 130-1. Therefore, this arrangement may be undesirable in some systems.

Figure 5A:
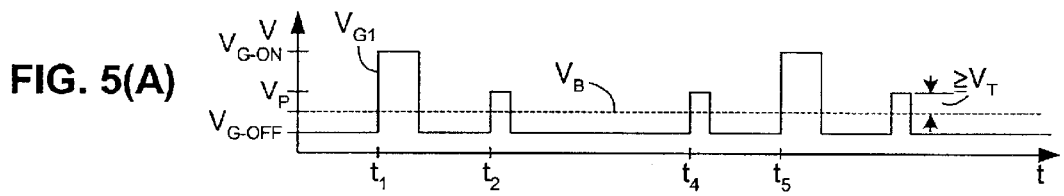
FIGS. 5(A) and 5(B) are a timing diagrams illustrating the operation of the imager system of FIG. 2 according to another aspect of the present invention.
Figure 5B:
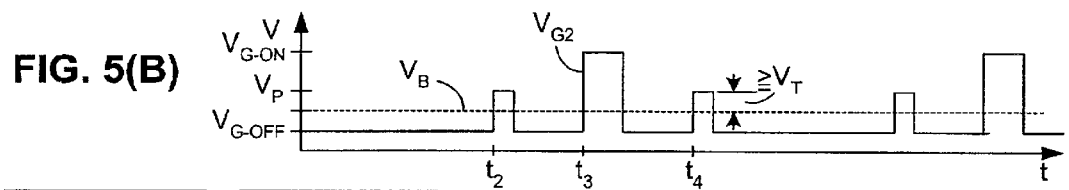

Referring to FIGS. 5(A) and 5(B), in another embodiment, crosstalk to other pixels on the same data line is avoided by pulsing the gate voltage to each pixel during non-readout/reset cycles of other pixels connected to the data line. Referring briefly to FIG. 1, pixels 110-1 and 110-2 include access transistors connected to the same data line 130-1, but are controlled by gate voltages transmitted on separate gate lines (i.e., gate lines 125-1 and 125-2, respectively). FIG. 5(A) shows gate signal $V_{G1}$ that is transmitted on gate line 125-1 to pixel 110-1, and FIG. 5(B) shows gate signal $V_{G2}$, which is transmitted on gate line 125-2 to pixel 110-2. As shown in FIG. 5(A), pixel 110-1 is read out and reset at time $t_1$ by pulsing gate signal $V_{G1}$ to voltage level $V_{G\text{-}ON}$ (e.g., 10V). Similarly, as shown in FIG. 5(B), pixel 110-2 is read out and reset at time $t_3$ by pulsing gate signal $V_{G2}$ to voltage level $V_{G\text{-}ON}$. In addition, at a time $t_2$ (i.e., a time during which none of the pixels connected to data line 125-1 are turned on), all gate signals $V_{G1}$, $V_{G2}$ . . . of the entire array are pulsed at a voltage level that is between gate on voltage $V_{G\text{-}ON}$ and gate off voltage $V_{G\text{-}OFF}$. This extra clamping pulse should occur during exposure, but can occur, for example, while A/D converter 150 is generating digital data values (see FIG. 2). Because sense amplifier 135 of these front-end circuits is inactive at this point, dumping a small quantity of charge onto data line 125-1 should be inconsequential. Note that typical scanning control circuits 120 should allow addition of this extra clamping pulse to the gate signals using existing electronics.

Figure 6:
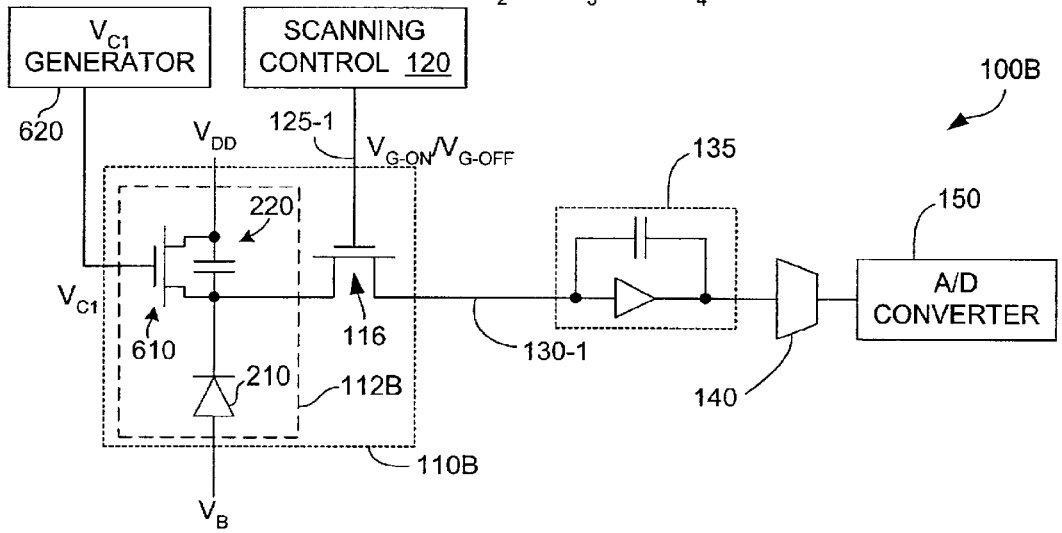
FIG. 6 is a simplified diagram showing a single pixel circuit of an imager system according to another embodiment of the present invention.

FIG. 6 is a simplified circuit diagram showing a representative pixel 110B and associated circuitry of an imager system 100B, which represents another embodiment of imager system 100 (shown in FIG. 1). Each pixel 110B includes a sensor circuit 112B and an access TFT 116. Similar to sensor circuit 112A (see FIG. 2), sensor circuit 112B includes a photodiode 210 and a storage capacitor 220, but also includes a clamp transistor 610 connected across storage capacitor 220 between system voltage source VDD and the cathode of photodiode 210. The anode of photodiode 210 is connected to a bias voltage $V_B$ (e.g., 5V). In addition, a clamp voltage generator ($V_{C1}$ GENERATOR) 620 generates a global clamp voltage $V_{C1}$ that is applied to the gate terminals of each clamp transistor 610 of imager system 100B. Other structural elements of imager system 100B that are essentially identical to corresponding elements of the embodiments described above are identified with like reference numbers, and detailed description of these elements is omitted for brevity.

Figure 7:
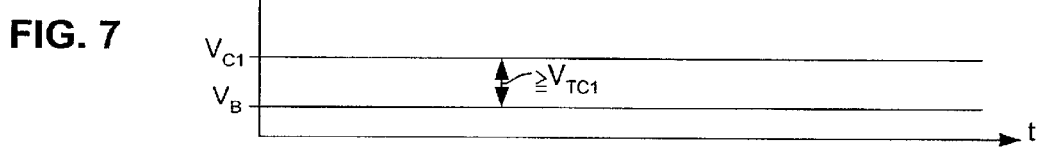
FIG. 7 is a timing diagram illustrating the operation of the imager system of FIG. 6 according to another aspect of the present invention.

As indicated in FIG. 7, clamp voltage $V_{C1}$ is maintained at a value greater than one $V_{TC1}$ above bias voltage $V_B$, where $V_{TC1}$ is the threshold voltage of clamp transistor 610, thereby causing clamp transistor 610 to drain excess charge from storage capacitor 220 before photodiode 210 saturates. During typical operation of a high fill-factor image sensor array, the voltage across photodiode 210 changed (e.g., increases) linearly at moderate light levels until it saturates when the photodiode reaches forward bias. Charge accumulated in the saturated pixel spills over into adjacent pixels because the contact voltage of the adjacent pixels is different, and because the continuous sensor material provides a path for the crosstalk current. By maintaining clamp voltage $V_{C1}$ well above bias voltage $V_B$ (i.e., at least one threshold voltage $V_{TC1}$), clamp transistor 610 is able to drain excess charge from storage capacitor 220 before photodiode 210 saturates, thereby preventing crosstalk between pixel 110-B and any adjacent pixels (not shown).

As discussed above, crosstalk is an issue in high fill-factor arrays having a continuous sensor material layer because, as illumination levels change from pixel to pixel, the potential on each pixel contact is different. The crosstalk current between adjacent pixels occurs due to these differences in pixel contact voltages. Therefore, an ideal amplifier circuit to place on each pixel would maintain the voltage level of the contact at a fixed, predetermined level, thereby preventing crosstalk by eliminating voltage potentials between the pixel contacts.

Figure 8:
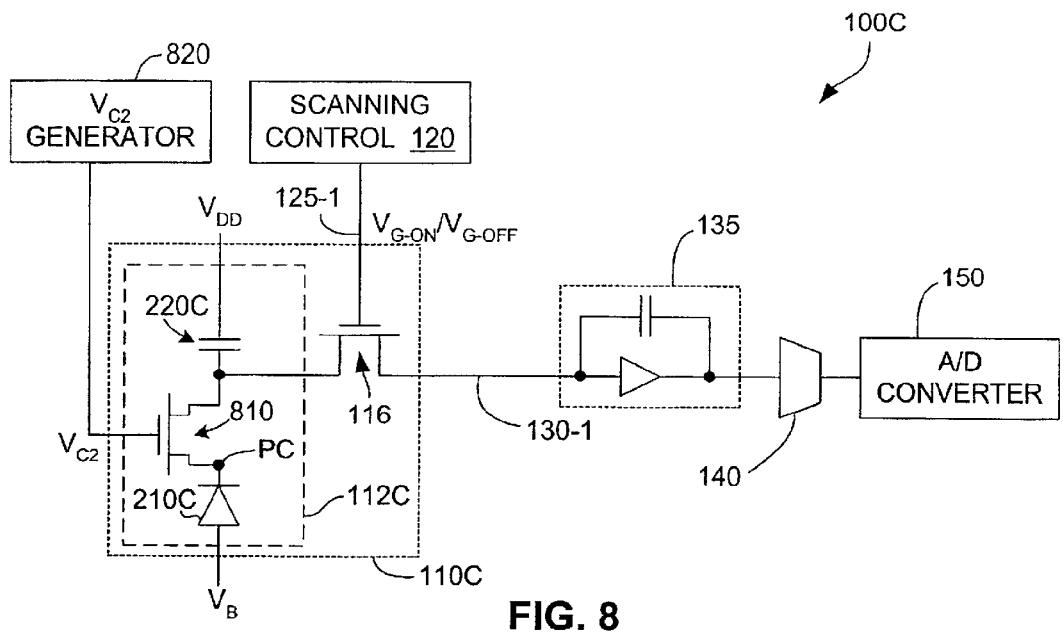
FIG. 8 is a simplified diagram showing a single pixel circuit of an imager system according to another embodiment of the present invention.

FIG. 8 is a simplified circuit diagram showing a representative pixel 110C and associated circuitry of an imager system 100C, which represents another embodiment of imager system 100 (shown in FIG. 1). Each pixel 110C includes a sensor circuit 112C and an access TFT 116. Similar to sensor circuit 112 (see FIG. 2), sensor circuit 112C includes a photodiode 210C and a storage capacitor 220C, but also includes a cascode transistor 810 connected between storage capacitor 220C and the cathode of photodiode 210C. In particular, cascode transistor 810 is connected between a pixel contact PC, which is located at the cathode of photodiode 210C, and a first terminal of storage capacitor 220C. In addition, imager system 100C includes a cascode voltage generator ($V_{C2}$ GENERATOR) 820 that generates a global cascode control voltage $V_{C2}$ that is applied to the gate terminals of each cascode transistor 810. Other structural elements of imager system 100C that are essentially identical to corresponding elements of the embodiments described above are identified with like reference numbers, and detailed description of these elements is omitted for brevity.

Figure 9:
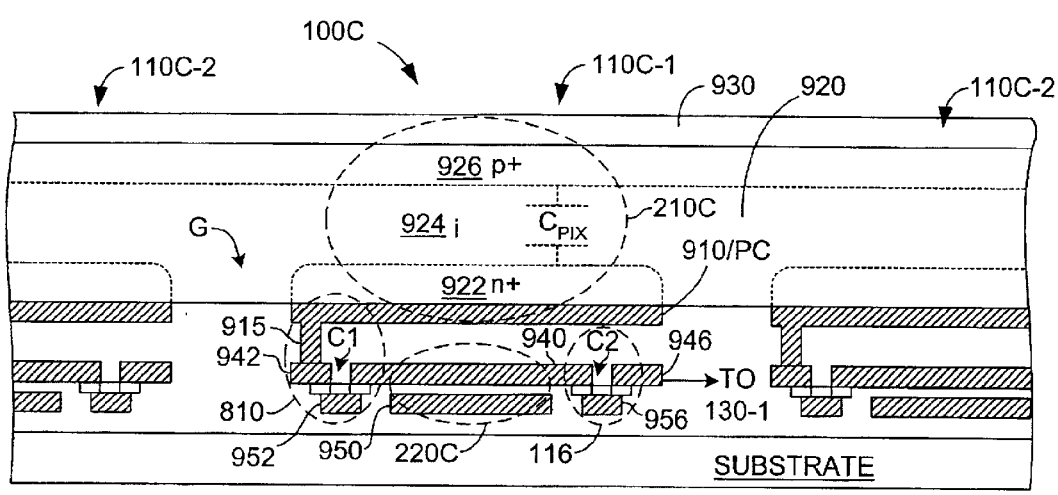
FIG. 9 is a simplified cross-sectional elevation view depicting the pixel circuit of FIG. 8 according to another embodiment of the present invention.

FIG. 9 is a simplified cross-sectional side view showing a portion of imager system 100C in additional detail. In particular, FIG. 9 shows a first pixel 110C-1 and portions of adjacent pixels 100C-2.

Similar to embodiments described above, each pixel (e.g., pixel 110C-1) includes a photodiode 210C formed by a (first) metal plate 910 that forms the pixel contact PC, a continuous a-Si:H layer 920, and a transparent bias (e.g., ITO) layer 930. Continuous a-Si:H layer 920 includes several relatively heavily n-type (n+) doped regions 922 formed over each pixel contact 910, a continuous central undoped (intrinsic, or "i") region 926, and a continuous relatively heavily p-type (p+) doped regions 922 that abuts a lower surface of bias layer 930. Note that each n+ doped region 922 is separated by a region G of undoped (intrinsic) a-Si:H from the n+ doped regions of adjacent pixels 110C-2.

Unlike the embodiments described above, however, each pixel of imager system 100C includes a storage capacitor 220C that is separated from pixel contact 910 (i.e., neither plate of storage capacitor 220C is formed by pixel contact 910, as in earlier described embodiments). Instead, storage capacitor 220C includes a second metal plate 940 located below pixel contact 910, and a third metal plate 950 located below second metal plate 940. During fabrication, third metal plate 950 is formed from a first metal layer, and second metal plate 940 is formed from a subsequently deposited second metal layer such that plates 940 and 950 are separated by a suitable insulation layer.

Additional metal structures are utilized to form cascode transistor 810, which is connected between pixel contact 910 and second metal plate 940, and access transistor 116, which is formed between second metal plate 940 and the associated data line 130-1. In particular, cascode transistor 810 includes a first metal portion 942, a gate portion 952, and a portion of second metal plate 940. First metal portion 942 is connected to first metal plate 910 by a metal via structure 915, and is formed from the same metal layer as that used to form second metal plate 940. Gate portion 952 is located under a channel C1 separating first metal portion 942 and second metal plate 940, and is formed from the same metal layer as that used to form third metal plate 950. Similarly, access transistor 116 includes a second gate portion 956 located under a channel C2 separating second metal portion 940 and a third metal structure 956 that is connected to the associated data line 130-1. Second gate portion 956 is also formed from the same metal layer as that used to form third metal plate 950.

Figure 10:
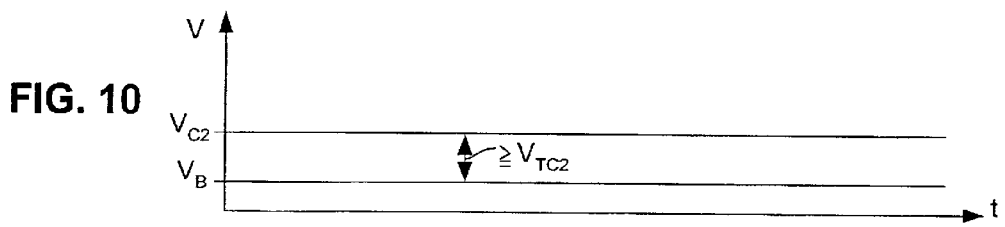
FIG. 10 is a timing diagram illustrating the operation of the imager system of FIG. 8 according to another aspect of the present invention.

As indicated in FIG. 10, cascode control voltage $V_{C2}$ is maintained at a value greater than one $V_{TC2}$ above bias voltage $V_B$, where $V_{TC2}$ is the threshold voltage of cascode transistor 810, thereby causing cascode transistor 810 to drain all photo-generated charge from pixel contact 910/PC such that a constant voltage is maintained across photodiode 210C (FIG. 8). The photo-generated charge is released through cascode transistor 810 and stored on storage capacitor 220C, where it remains until subsequent readout and reset through TFT 116 and charge amplifier 135.

While the present invention has been directed thus far to crosstalk issues, the cascode approach described above may also be utilized to improve resolution through the reduction of image aliasing. Image detail is expressed by its spatial frequency. Analogous to the temporal frequency that describes signal repetition in time, the spatial frequency of an image describes signal repetition in space. This space is two-dimensional for flat panel imagers, such as those described herein. A low frequency describes an image in which dark and light features that are far apart, and a high frequency describes dark and light features that repeat over a short distance. In mathematical terms, sampling a signal is multiplying it in space with a two dimensional array of infinitely short impulses, spaced T meters apart. This corresponds to convoluting the signal spectrum in the frequency domain with an array of impulses spaced $1/T\ m^{-1}$ from each other. Image aliasing occurs when image details finer than half the pixel pitch are captured. Even when the image does not contain such fine details, the image noise, which stretches out uniformly over the entire frequency band, will. In order to avoid aliasing, the unwanted high-frequency image components must be filtered out before they are sampled by the imager pixels. Once they're on the pixel, there is no way to separate aliasing from the actual lower frequency signals. Imager pixels, however, have a finite size. As a result, the impulses in the frequency domain are not uniform over the entire spectrum. They follow a sin(a)/a envelope. The higher order spectra of the sampled signal are also weighed according to this envelope. The aliasing effects are thus also weighed according to this envelope. Widening the pixels reduces aliasing, but cannot eliminate aliasing completely.

By providing a continuous sensor material layer, high fill-factor image sensor arrays, such as those described herein, provide the widest possible pixels and therefore reduce the impact of aliasing, but do not completely eliminate it. In many imaging systems, the image source can be designed to reject high spatial frequencies, for example by designing the focus of the optical system to blur the image and reject high spatial frequencies. Indirect x-ray detection typically does not have much of a problem with aliasing, since the phosphor rejects high spatial frequencies. However, in direct detection imagers, the effects of aliasing can be clearly seen. Even if the imager can be designed so that high spatial frequencies are filtered on the imager, the noise will also be aliased, reducing the Detector Quantum Efficiency (DQE) of the imager. Ideally, however, there would be a way to filter high spatial frequency signals prior to imaging.

Figure 11:
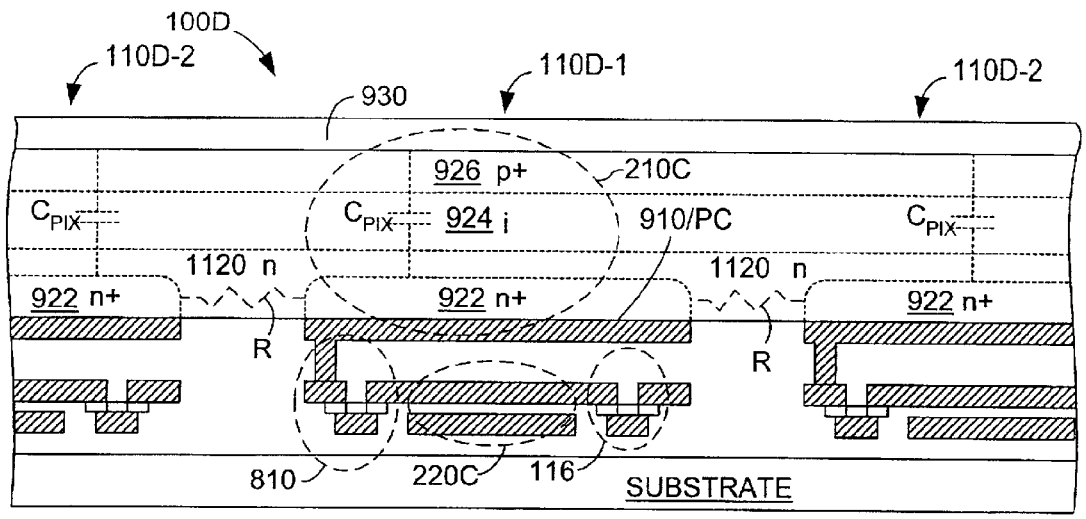
FIG. 11 is a simplified cross-sectional elevation view depicting the pixel circuit of FIG. 8 according to yet another embodiment of the present invention.
Figure 12:
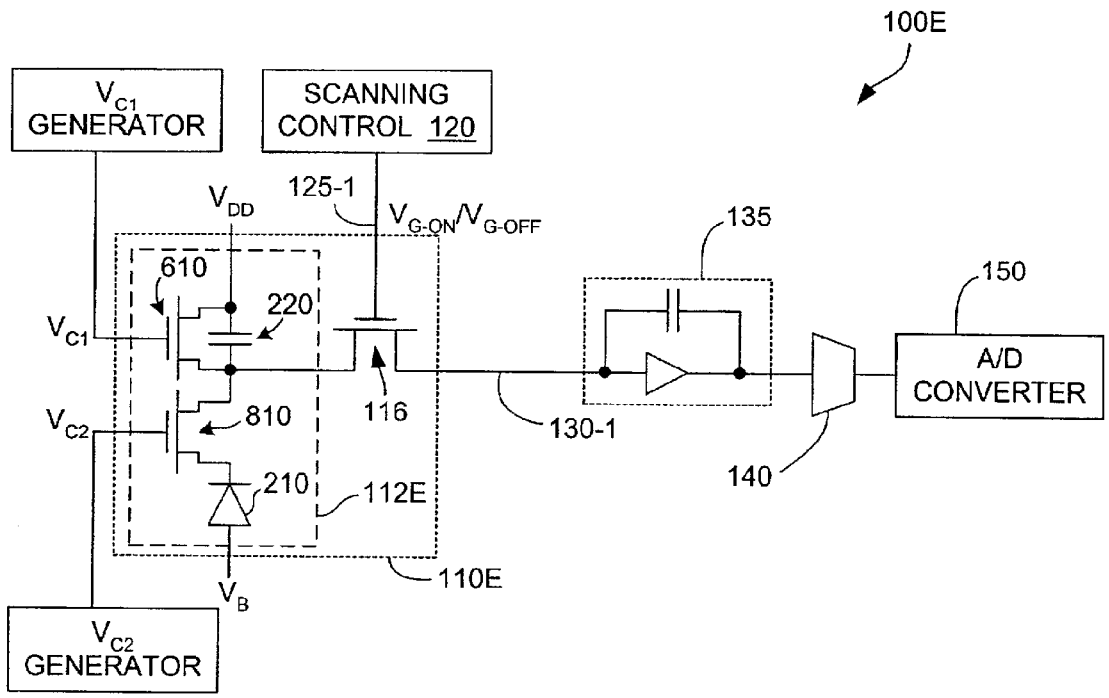
FIG. 12 is a simplified diagram showing a single pixel circuit of an imager system according to yet another embodiment of the present invention.

FIG. 11 is a simplified cross-sectional side view showing a portion of imager system 100D according to another embodiment of the present invention that addresses the aliasing problem. Imager system 100D is essentially identical to imager system 100C (FIGS. 8 and 9), but includes a resistive film (resistor region) 1120 connecting all of the n+ regions 922, thereby effectively forming resistors R (depicted in dashed lines) between adjacent pixel electrodes 910/PC. Other structural elements of imager system 100D that are essentially identical to corresponding elements of the embodiments described above are identified with like reference numbers, and detailed description of these elements is omitted for brevity.

As mentioned above, a continuous layer of sensor material 920 is sandwiched between a continuous transparent biasing layer 930 and a plurality of spaced apart pixel contacts 910/PC. Sensor material layer 920 includes an intermediate continuous undoped (intrinsic) layer 924 sandwiched between a plurality of spaced-apart, relatively highly doped regions 922 and a continuous doped layer 926. In accordance with the present embodiment, resistive film 1120 is doped with the same dopant type (e.g., n-type) as that used in relatively highly doped (n+) regions 922, but has a doping level (concentration) that is between that of relatively highly doped (n+) regions 922 and undoped region 924.

By placing resistive film 1120 between the pixels of imager system 110D, the charge that collects on each pixel contact 910/PC is allowed to leak (blur) into neighboring pixels. As a result, resistive film 1120 smoothes out the finer image details and reduces the higher frequency content that causes aliasing. Note that when connected to a standard pixel circuit (similar to those shown in FIG. 2), the resistive layer would have a disadvantage, because the resistive redistribution of the charge collected on the pixels that are read first will be different that the redistribution for pixels that are read later. Therefore, resistive film 1120 is preferably utilized in combination with cascode transistor 810, described above, to prevent redistribution of charge once the charges have been successfully collected. The only requirement will be that the resistance between pixels exceeds $1/g_m$ of the cascode transistor, otherwise the generated charge is blurred completely before it gets through cascode trasistor 810 and into storage capacitor 220C.

Another way of looking at image blurring to reduce aliasing is that resistive sheet 1120, combined with the pixel capacitance $C_{PIX}$, which represents the effective capacitance per unit area of photodiode 210C (shown in FIG. 11), can be seen as a low-pass analog spatial filter sitting right before the digital sampling pixel electrodes. The high spatial frequency part of the signal is filtered out by resistive film 1120 in combination with the distributed sensor capacitance $C_{PIX}$ before it gets into the sampling stage and causes aliasing. Equation 1 describes this low-pass spatial filter:

$$\begin{cases} \nabla \cdot \vec{J} = \dfrac{\partial Q}{\partial t} = C_{pixel} \dfrac{\partial V}{\partial t} \\ \vec{J} = \dfrac{\nabla V}{\rho} \end{cases} \quad \text{Eq. 1}$$

Equation 1 is a typical continuity equation, where J is the 2D current density vector on the resistive film plane, $C_{PIX}$ is the sensor capacitance per unit area, Q is the charge per unit area on the resistive film, V is the potential on the resistive film and ρ is the resistivity of resistive film 1120. Solving these two equations provides:

$$\dfrac{\nabla^2 V}{\rho} = C_{pixel} \cdot \dfrac{\partial V}{\partial t} \quad \text{Eq. 2}$$

and the typical normal solution for this partial differential equation is:

$$Q \propto e^{i\vec{k}\cdot\vec{x}} \cdot e^{\frac{-t}{\tau_0}}, \text{ with } \tau_0 = \dfrac{\rho \cdot C_{pixel}}{k^2} \quad \text{Eq. 3}$$

where k is the spatial wave vector and $\tau_0$ is the decaying time constant for the specific spatial radial frequency k. It is obvious from Equation 2 that signals with higher spatial frequency (larger k) have smaller time constant (decay faster). Therefore, if signal charge is collected a little after it was generated, high spatial frequency components are filtered out.

However, this resistive-film low-pass spatial filter arrangement provides little benefit in regular flat panel imager with a conventional pixel circuit that has the storage capacitor connected directly to the pixel (e.g., imager system 100A; see FIG. 2). The usual frame times are in the order of hundreds of ms for radioscopic imaging and tens of ms for fluoroscopic system. Both are much longer than the photon absorption and blurring process described above. If the low-pass spatial filter is implemented with a conventional pixel circuit, the high and middle spatial frequency part of the signal is thus damped out completely for photons that arrive at the beginning of the frame cycle and damped too little for photons received near the end of each frame cycle.

In contrast, imager system 100D includes cascode transistor 810 between storage capacitor 220C and pixel contact 910/PC. Cascode transistor 810 drains the pixel charge much quicker than in conventional pixel circuits (similar to those shown in FIG. 2), and dumps the drained charge on storage capacitor 220C. The cascode arrangement also drains all of the pixels at the same time. Therefore, the desired low-pass cut-off frequency, or the corresponding amount of image blur, is defined by matching the source impedance of the cascode circuit to the resistance of resistive film 1120 (which sets the amount image blurring). The effective resistors R and the effective pixel capacitance $C_{PIX}$ controls how fast pixel charge leaks into neighboring pixels. The cascode source impedance $1/g_m$, in combination with effective pixel capacitance $C_{PIX}$ sets how quickly the charge is collected from the pixel and dumped on storage capacitor 220C.

As mentioned above, sensor layer 920 can be regarded as a distributed capacitor with a single plate (i.e., bias layer 930) at one side, and separate pixel contacts 910 connected by resistive film 1120 at the other. A light pulse entering sensor layer 920 generates electron-hole pairs that are quickly pulled apart by the applied electric field and collected on the pixel plates, thereby pulling the voltage across photodiode 210C down. As this photodiode potential is pulled down over a particular pixel 110D-1, a voltage drop is created across resistors film 1120 causes the pixel charge to bleed into neighboring pixels 110D-2, where it is collected on the storage capacitors of these adjacent pixels. For this process to happen as described, the cascode source impedance should be selected smaller than the resistance of resistor film 1120.

Note that the low-pass filtering effect of resistive film 1120 is not only effective for removing aliasing effect from the signal generated by incoming photons. Resistive film 1120 can also filter out the high spatial frequency part of the detector noise. This effect would increase the Detector Quantum Efficiency (DQE), especially for ultra high-resolution flat panel imagers such as in direct detection X-ray imagers.

Further, because resistive film 1120 changes the electric field between the pixels, it helps to collect the electron-hole pairs generated between the imager pixels much quicker, actually just as quick as the electron-hole pairs generated above the pixels. This collection efficiency avoids the situation in conventional image sensor arrangements where charge generated between pixels is sometimes trapped in deep traps at the interface between the sensor layer and the underlying layers. If any trapped charge appears, the resistive film provides a fast draining path for these trapped charges. In conventional full-fill factor arrays, trapped charges release very slowly and lead to image lag over several frames. This effect is particularly noticeable and problematic for direct detection X-ray imagers such as the ones using a-Se as sensor material.

FIG. 12 is a simplified circuit diagram showing a representative pixel 110E and associated circuitry of an imager system 100E, which represents another embodiment of imager system 100 (shown in FIG. 1). Each pixel 110E includes a sensor circuit 112E and an access TFT 116. Similar to sensor circuit 112 (see FIG. 2), sensor circuit 112E includes a photodiode 210C and a storage capacitor 220C, but also includes both a cascode transistor 810 (described above with reference to FIGS. 8 and 9) and clamp transistor 610 (described above with reference to FIG. 6). Other structural elements of imager system 100E that are essentially identical to corresponding elements of the embodiments described above are identified with like reference numbers, and detailed description of these elements is omitted for brevity. By including both clamp transistor 610 and cascode transistor 810 in each pixel 110E, imager system 100E provides the benefits described above that are associated with each of these circuits.

Although the present invention has been described with respect to certain specific embodiments, it will be clear to those skilled in the art that the inventive features of the present invention are applicable to other embodiments as well. For example, sensor arrays incorporating the present invention may be modified for indirect detection as well as direct detection methods according to known practices. Those familiar with integrated circuit structures will recognize such modifications can be utilized without departing from the spirit and scope of the invention described herein (e.g., using p-type instead of n-type transistors, reversing voltage and/or photodiode polarities, and using a resistive sensor rather than a photodiode).

What is claimed is:

1. An imager system comprising
    a scanning control circuit for generating gate voltage signals on a plurality of gate lines;
    a continuous sensor layer;
    a bias voltage source; and
    a plurality of pixels arranged in an array, each pixel including:
        a sensor including an associated portion of the continuous sensor layer and having a first terminal connected to the bias voltage source, the sensor also having a second terminal;
        a storage capacitor having a first terminal coupled to the second terminal of the sensor, and a second terminal connected to a system voltage source; and
        an access transistor having a first terminal connected to the first terminal of the storage capacitor, a second terminal connected to an associated data line, and a gate terminal coupled to an associated gate line of the plurality of gate lines controlled by the scanning control circuit;
    wherein the imager system further comprises means connected to at least one of the sensor and the access transistor of each of said plurality of pixels for controlling a voltage across the sensor of each of the plurality of pixels such that the sensor of each of the plurality of pixels is prevented from reaching saturation.

2. The imager system according to claim 1,
    wherein the second terminal of said each sensor comprises a first metal plate contacting a first region of the associated portion of the continuous sensor layer, and the first terminal of said each sensor comprises a transparent biasing layer formed on a second region of the associated portion of the continuous censor layer,
    wherein the storage capacitor comprises a second metal plate connected to the first metal plate, and a third metal plate located below the second metal plate,
    wherein the transparent biasing layer is connected to the bias voltage source, and wherein the third metal plate is connected to the system voltage source.

3. The imager system according to claim 1,
wherein said scanning control circuit generates a first voltage signal on a selected gate line to turn on the access transistor of a selected pixel during a first operating period, and generates a second voltage signal on the selected gate line to turn off the access transistor of the selected pixel during a second operating period,
wherein the bias voltage source generates the bias voltage at a voltage level that differs from the second voltage signal generated by the gate line control circuit by at least one threshold voltage of the access transistor.

4. The imager system according to claim 1,
wherein said scanning control circuit generates a first gate signal on a first gate line connected to a first pixel and a second gate signal on a second gate line connected to a second pixel, both the first and second pixels being connected to an associated data line,
wherein the first gate signal includes a first voltage pulse in which the first gate line is changed from a first voltage level to a second voltage level at a first operating times,
wherein the second gate signal includes a second voltage pulse in which the second gate line is changed from the first voltage level to the second voltage level at a second operating time, and
wherein both the first and second gate signals include a third voltage pulse at a third operating time that is between the first operating time and the second operating time, and changes the first and second gate lines from the first voltage level to a third voltage level that is between the first voltage level and the second voltage level.

5. The imager system according to claim 1, wherein said means comprises a clamp transistor connected between the system voltage source and the second terminal of the sensor.

6. The imager system according to claim 5,
wherein said scanning control circuit generates a first voltage signal on a selected gate line to turn on the access transistor of a selected pixel during a first operating period, and generates a second voltage signal on the selected gate line to turn off the access transistor of the selected pixel during a second operating period, and
wherein the imager system further comprises means connected to a gate terminal of the clamp transistor for generating a clamp voltage having a voltage level that differs from the bias voltage signal generated by the bias voltage source by at least one threshold voltage of the clamp transistor.

7. The imager system according to claim 1, wherein said means comprises a cascode transistor connected between the first terminal of the storage capacitor and the second terminal of the sensor.

8. The imager system according to claim 7,
wherein said scanning control circuit generates a first voltage signal on a selected gate line to turn on the access transistor of a selected pixel during a first operating period, and generates a second voltage signal on the selected gate line to turn off the access transistor of the selected pixel during a second operating period, and
wherein the imager system further comprises means connected to a gate terminal of the cascade transistor for generating a clamp voltage having a voltage level that differs from the bias voltage by at least one threshold voltage of the cascade transistor.

9. The imager system according to claim 7,
wherein said sensor comprises a first metal plate, a sensor layer formed on the first metal plate, and a transparent biasing layer formed on the sensor layer,
wherein the storage capacitor comprises the second metal plate and a third metal plate located below the second metal plate,
wherein the cascode transistor is connected between the first metal plate and the second metal plate, and
wherein the access transistor is formed between the second metal plate and the associated data line.

10. The imager system according to claim 9,
wherein the first metal plate is formed from a first metal layer,
wherein the second metal plate is formed from a second metal layer located below the first metal layer,
wherein the third metal plate is formed from a third metal layer located below the second metal layer,
wherein the cascode transistor comprises a first metal portion formed from the second metal layer, the first metal portion being connected to the first metal plate by a metal via structure, the cascode transistor also including a first gate portion located under a channel separating the first metal portion and the second metal plate, the first gate portion being formed from the third metal layer, and
wherein the access transistor comprises a second gate portion located under a channel separating the second metal portion and the associated data line, the second gate portion being formed from the third metal layer.

11. The imager system according to claim 9, wherein the sensor layer comprises an amorphous silicon layer including a plurality of spaced-apart lower doped regions,
each lower doped region being formed over the first metal plate of an associated pixel, a continuous undoped layer extending over the plurality of pixels, and an upper Continuous doped region abutting the transparent biasing layer.

12. The imager system according to claim 11, wherein the plurality of spaced-apart lower doped regions comprise relatively high doping concentrations, and wherein the sensor layer further comprises a resistor region connecting the plurality of lower doped regions, the resistor region comprising a relatively low doping concentration.

13. The imager system according to claim 9, wherein the sensor comprises a photoresistive material selected from the group consisting of Se, $PbI_2$, and HgI.

14. The imager system according to claim 7, further comprising a clamp transistor connected between the system voltage source and the second terminal of the sensor.

15. An imager system comprising;
a scanning control circuit for generating gate voltage signals on a plurality of gate lines;
a continuous sensor layer;
a bias voltage source; and
a plurality of pixels arranged in an array, each pixel including:
a sensor including an associated portion of the continuous sensor layer and having a first terminal connected to the bias voltage source, the sensor also having a second terminal;
a storage capacitor having a first terminal coupled to the second terminal of the sensor, and a second terminal connected to a system voltage Source;

an access transistor having a first terminal connected to the first terminal of the storage capacitor, a second terminal connected to an associated data line, and a gate terminal coupled to an associated gate line of the plurality of gate lines controlled by the scanning control circuit; and a clamp transistor connected across the storage capacitor between the system voltage source and the second terminal of the sensor.

16. The imager system according to claim 15, wherein the second terminal of said each sensor comprises a first metal plate contacting a first region of the associated portion of the continuous sensor layer, and the first terminal of said each sensor comprises a transparent biasing layer formed on a second region of the associated portion of the continuous sensor layer, wherein the storage capacitor comprises a second metal plate connected to the first metal plate, and a third metal plate located below the second metal plate, wherein the transparent biasing layer is connected to the bias voltage source, and wherein the third metal plate is connected to the system voltage source.

17. The imager system according to claim 15, wherein said scanning control circuit generates a first voltage signal on a selected gate line to turn on the access transistor of a selected pixel during a first operating period, and generates a second voltage signal on the selected gate line to turn off the access transistor of the selected pixel during a second operating period, and wherein the imager system further comprises means connected to a gate terminal of the clamp transistor for generating a clamp voltage having a voltage level that is at least one threshold voltage above the bias voltage signal generated by the bias voltage source.

18. The imager system according to claim 15, further comprising a cascode transistor connected between the storage capacitor and the second terminal of the sensor.

19. An imager System comprising:

a scanning control circuit for generating gate voltage signals on a plurality of gate lines;

a continuous sensor layer;

a bias voltage source; and a plurality of pixels arranged in an array, each pixel including:

a sensor having an first terminal connected to a bias voltage source, the sensor also having a second terminal;

a storage capacitor including an associated portion of the continuous sensor layer and having a first terminal coupled to the second terminal of the sensor and a second terminal connected to a system voltage source;

an access transistor having a first terminal connected to the first terminal of the storage capacitor, a second terminal connected to an associated data line, and a gate terminal coupled to an associated gate line of the plurality of gate lines controlled by the scanning control circuit; and a cascode transistor connected between the first terminal of the storage capacitor and the second terminal of the sensor.

20. The imager system according to claim 19, wherein said scanning control circuit generates a first voltage signal on a selected gate line to turn on the access transistor of a selected pixel during a first operating period, and generates a second voltage signal on the selected gate line to turn off the access transistor of the selected pixel during a second operating period, and wherein the imager system further comprises means connected to a gate terminal of the cascode transistor for generating a clamp voltage having a voltage level that differs from the bias voltage by at least one threshold voltage of the cascode transistor.

21. The imager system according to claim 19, wherein said sensor comprises a first metal plate, wherein said continuous sensor layer is formed on the first metal plate, wherein a transparent biasing layer is formed on the continuous sensor layer, wherein the storage capacitor comprises the second metal plate and a third metal plate located below the second metal plate, wherein the cascode transistor is connected between the first metal plate and the second metal plate, and wherein the access transistor is formed between the second metal plate and the associated data line.

22. The imager system according to claim 19, wherein the first metal plate is formed from a first metal layer, wherein the second metal plate is formed from a second metal layer located below the first metal layer, wherein the third metal plate is formed from a third metal layer located below the second metal layer, wherein the cascode transistor comprises a first metal portion formed from the second metal layer, the first metal portion being connected to the first metal plate by a metal via structure, the cascode transistor also including a first gate portion located under a channel separating the first metal portion and the second metal plate, the first gate portion being formed from the third metal layer, and wherein the access transistor comprises a second gate portion located under a channel separating the second metal portion and the associated data line, the second gate portion being formed from the third metal layer.

23. The imager system according to claim 19, wherein the continuous sensor layer comprises an amorphous silicon layer including a plurality of spaced-apart lower doped regions, each lower doped region being formed over the first metal plate of an associated pixel, a continuous undoped layer extending over the plurality of pixels, and an upper continuous doped region abutting the transparent biasing layer.

24. The imager system according to claim 23, wherein the plurality of spaced-apart lower doped regions comprise relatively high doping concentrations, and wherein the continuous sensor layer further comprises a resistor region connecting the plurality of lower doped regions, the resistor region comprising a relatively low doping concentration.

25. The imager system according to claim 19, wherein the sensor comprises a photoresistive material selected from the group consisting of Se, $PbI_2$, and HgI.

26. An imager system comprising:

a scanning control circuit for generating gate voltage signals on a plurality of gate lines;

a continuous layer of sensor material including a plurality of spaced-apart, relatively highly doped regions, a continuous undoped layer formed over the plurality of relatively highly doped regions, and a continuous doped layer formed over the undoped layer;

a bias voltage source; and a plurality of pixels arranged in an array, each pixel including:
- a sensor including an associated portion of the continuous layer of sensor material sensor and having a first terminal connected to a bias voltage source, the sensor also having a pixel contact abutting an associated highly doped region of the plurality of spaced apart highly doped regions;
- a storage capacitor having a first terminal and a second terminal, the second terminal being connected to a system voltage source;
- an access transistor having a first terminal connected to the first terminal of the storage capacitor, a second terminal connected to an associated data line, and a gate terminal coupled to an associated gate line of the plurality of gate lines controlled by the scanning control circuit; and
- a cascode transistor connected between the first terminal of the storage capacitor and the second terminal of the sensor, wherein the continuous layer further comprises a resistor region formed below the continuous undoped layer and contacting the plurality of spaced-apart, relatively highly doped regions, and wherein the resistor region has a doping level greater than the continuous undoped layer and less than the plurality of spaced-apart, relatively highly doped regions.

* * * * *

UNITED STATES PATENT AND TRADEMARK OFFICE
CERTIFICATE OF CORRECTION

PATENT NO. : 6,720,594 B2　　　　　　　　　　　　　　　　　　　　　　　Page 1 of 1
DATED : April 13, 2004
INVENTOR(S) : Jeffrey T. Rahn et al.

It is certified that error appears in the above-identified patent and that said Letters Patent is hereby corrected as shown below:

<u>Column 1,</u>
Line 3, insert the following as a new paragraph:
-- This invention was made with United States Government support under Agreement No. 70NANB7H3007 awarded by NIST. The United States Government has certain rights in this invention. --.

Signed and Sealed this

Ninth Day of May, 2006

JON W. DUDAS
*Director of the United States Patent and Trademark Office*